United States Patent [19]

Matsumoto

[11] Patent Number: 4,897,334
[45] Date of Patent: Jan. 30, 1990

[54] PHOTO-SENSITIVE RECORDING MEDIUM HAVING LIGHT-SHIELDING MEANS ON OPPOSITE SIDE EDGES OF THE FILM

[75] Inventor: Yumio Matsumoto, Kasugai, Japan

[73] Assignee: Brother Kogyo Kabushiki Kaisha, Japan

[21] Appl. No.: 189,308

[22] Filed: May 2, 1988

[30] Foreign Application Priority Data

May 12, 1987 [JP] Japan .............................. 62-71288[U]

[51] Int. Cl.⁴ .......................... G03C 3/00; G03C 1/72
[52] U.S. Cl. .................................... 430/138; 430/496; 428/192; 428/193
[58] Field of Search ................ 428/192, 193; 430/496, 430/138

[56] References Cited

U.S. PATENT DOCUMENTS

| 2,609,294 | 9/1952 | Prentice | 430/496 |
| 3,041,196 | 6/1962 | Stella | 428/192 |
| 4,358,523 | 11/1982 | Ishiwata et al. | 430/496 |
| 4,370,409 | 1/1983 | Bostroem | 430/496 |
| 4,440,846 | 4/1984 | Sanders et al. | 430/138 |
| 4,588,665 | 5/1986 | Drexler | 430/496 |
| 4,629,676 | 12/1986 | Hayakawa et al. | 430/199 |
| 4,637,974 | 1/1987 | Kubit | 430/126 |

Primary Examiner—Roland E. Martin
Assistant Examiner—Patrick A. Doody
Attorney, Agent, or Firm—Kane, Dalsimer, Sullivan, Kurucz, Levy, Eisele and Richard

[57] ABSTRACT

A photo-sensitive recording medium comprising a continuous roll of photo-sensitive web. A pair of light-shielding areas are provided respectively on opposite side edges of the web. The light-shielding areas extend continuously along the respective opposite side edges of the web for shielding a light from penetrating into an interface between each pair of adjacent turns of the roll from opposite axial end faces of the roll.

8 Claims, 4 Drawing Sheets

PHOTO-SENSITIVE RECORDING MEDIUM HAVING LIGHT-SHIELDING MEANS ON OPPOSITE SIDE EDGES OF THE FILM

BACKGROUND OF THE INVENTION

This invention relates to a photo-sensitive recording medium for use in recording an image, for example, in a printer, a copying machine or the like.

In general, a photo-sensitive recording medium of the kind referred to above is stored and transported in the form of a continuous roll of photo-sensitive web. For such photo-sensitive recording medium, various measures have conventionally been taken to prevent the photo-sensitive recording medium from being unintentionally exposed to a light during storage and transportation.

Specifically, the continuous roll of photo-sensitive web is accommodated in a cylindrical light-shielding case like a cartridge (Patrone) for a photographic film. A slit-like outlet opening is formed in a projection projecting from a peripheral wall of the cartridge, and a light-shielding material such as cloth or the like is provided along the periphery of the outlet opening to shield a light from penetrating into the cartridge. Alternatively, as shown in FIG. 4, a continuous roll 32 of photo-sensitive web 32a is accommodated in a light-shielding case 31 formed into a closed box by a light-shielding material. The light-shielding case 31 has one side wall which is provided therein with an opening 33. At the opening 33, a light-shielding hatch 35 is arranged, which can be opened and closed by a lever 34. In use, the lever 34 is operated to open the light-shielding hatch 35 so that the photo-sensitive web 32a can be drawn out of the light-shielding case 31 through the opening 33. Further alternatively, as shown in FIG. 5, the photo-sensitive web 32a having connected to its leading end a light-shielding leader sheet 32a is wound into the roll 32 around a core 37 which is provided respectively at its both ends with a pair of end flanges 36 and 36. The light-shielding leader sheet 32b cooperate with the end flanges 36 and 36 to shield a light from penetrating into the interior of the roll 32, thereby preventing the photo-sensitive web 32a from being exposed.

In general, however, the light-shielding case 31 and the core 37 are almost all discarded without being collected and re-used after exposure of the photo-sensitive web 32 has been completed, i.e., the web 32 has been used. In particular, as the photo-sensitive web 32 increases in size, the light-shielding case 31 and the core 37 of a large size are required, resulting in an increase in the cost of the photo-sensitive recording medium. Accordingly, it has been desired to take measures to shield the photo-sensitive recording medium from a light inexpensively and reliably as far as possible.

SUMMARY OF THE INVENTION

It is therefore an object of this invention to provide an improved photo-sensitive recording medium capable of ensuring to prevent a photo-sensitive web in the form of a continuous roll from being exposed unintentionally during storage, transportation and the like.

For the above purpose, according to the invention, there is provided a photo-sensitive recording medium comprising a continuous roll of photo-sensitive web, and light-shielding means provided on opposite side edges of the web, the light-shielding means extending continuously along the opposite side edges of the web for shielding a light from penetrating into an interface between each pair of adjacent turns of the roll from opposite axial end faces of the roll.

BRIEF DESCRIPTION OF THE ACCOMPANYING DRAWINGS

DESCRIPTION OF THE EMBODIMENTS

Figure 1:
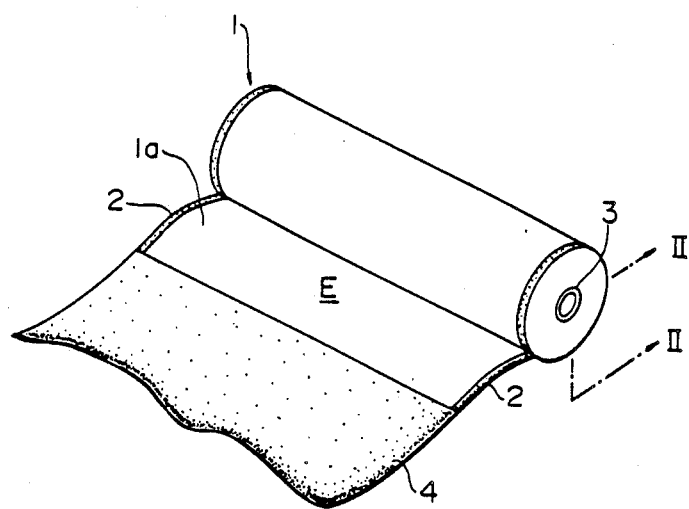
FIG. 1 is a perspective view of a photo-sensitive recording medium in the form of a continuous roll of photo-sensitive web, embodying the invention.

Referring to FIG. 1, there is shown a photo and pressure sensitive recording medium embodying the invention. The recording medium has a continuous photo and pressure sensitive web 1a wound into a roll 1 around a core 3. A photo-sensitive recording area E is defined at a widthwise central region of the web 1a and extends longitudinally of the web 1a. A pair of light-shielding areas 2 and 2 are provided respectively on opposite side edges of the web 1a. The light-shielding areas 2 and 2 continuously extend along the respective side edges of the web 1a. A light-shielding leader section 4 is connected to a leading end of the web 1a and has a length sufficient to wrap up an outer peripheral surface of the roll 1. It is to be understood that the light-shielding leader section 4 may be formed by a light-shielding leader sheet separate from the web 1a, or by a light-shielding material coated on the leading end portion of the web 1a.

Figure 2:
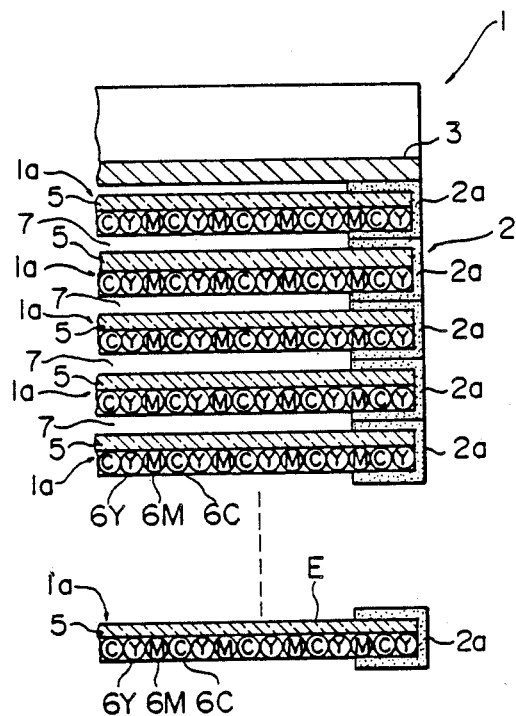
FIG. 2 is an exaggerated cross-sectional view taken along the line II—II in FIG. 1.

As exaggeratedly shown in FIG. 2, the web 1a is composed of a transparent resinous substrate 5, and various components coated on one side or a back side of the substrate 5 such that these various components are uniformly mixed with each other and are uniformly dispersed over the entire back side of the substrate 5. The components include a photo-curable resin changing and increasing in mechanical strength responsive to a light of a predetermined wavelength, a photo-sensitizer, a photo-polymerization initiator, microcapsules 6C each containing a cyan dye precursor, microcapsules 6M each containing a magenta dye precursor, microcapsules 6Y each containing a yellow dye precursor, and the like.

Each of the above-mentioned light-shielding areas 2 and 2 is formed by a light-shielding material 2a with which opposite sides of a corresponding one of the opposite side edges of the web 1a is coated such that the transparent resinous substrate 5 and the microcapsules 6C, 6M and 6Y are covered by the coated light-shielding material 2a. The light-shielding material 2a consists of a black paint in which one or more of carbon black, acetylene black, lampblack, bone black, graphite, iron black and cyanine black is or are dispersed and dissolved in a usual dye such as black dye or the like.

As clearly seen from FIGS. 1 and 2, the light-shielding areas 2 and 2 formed of the light-shielding material 2a cooperate with each other to shield the light from penetrating into an interface 7 between each pair of adjacent turns of the roll 1 from opposite axial end faces of the roll 1. Further, the light-shielding leader section 4 wraps up the outer peripheral surface of the roll 1. Thus, these light-shielding areas 2 and 2 and light-shielding leader section 4 cooperate with each other to shield the light from penetrating into the interior of the roll 1, thereby preventing the photo-sensitive recording area E from being exposed to light unintentionally during storage and transportation of the roll 1.

Figure 3:
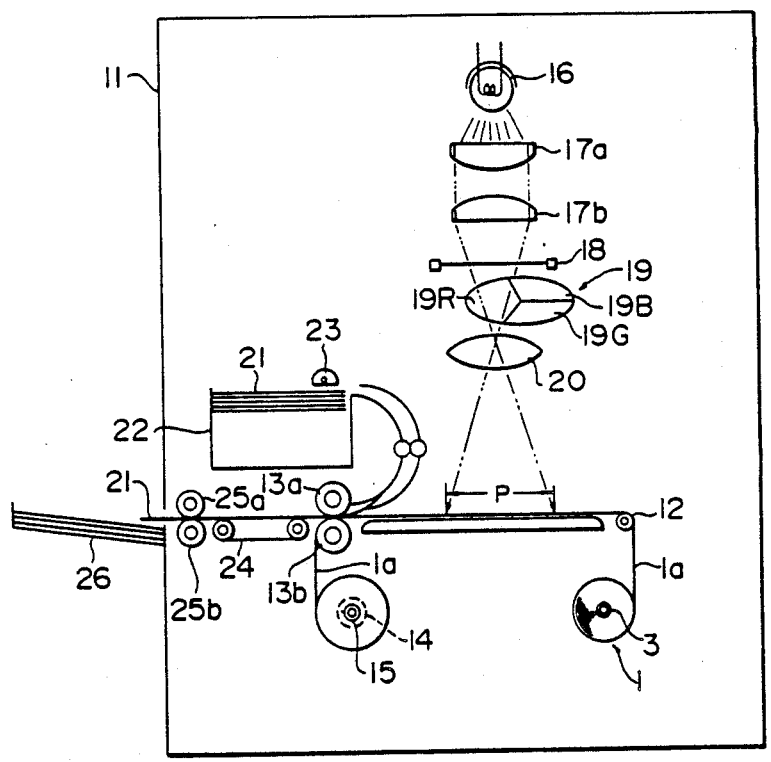
FIG. 3 is a schematic view of a color image recording apparatus which utilizes the photo-sensitive recording medium illustrated in FIG. 1.

A color image recording apparatus for recording a color image by the use of the photo and pressure sensitive recording medium illustrated in FIGS. 1 and 2 will be described with reference to FIG. 3.

The color image recording apparatus comprises a body 11. The continuous roll 1 of photo and pressure sensitive web 1a is arranged at a lower position within the body 11. The web 1a unwound from the roll 1 is guided by a guide roller 12 and runs horizontally. After the web 1a passes through an illuminating range P of a light from a halogen lamp 16 subsequently to be described, the web 1a passes through a nip between a pair of upper and lower pressure-developing rollers 13a and 13b and is wound around a take-up roller 15 which is rotatively driven by a motor 14.

The halogen lamp 16 is arranged above the running path of the web 1a, for emitting a white light to illuminate the web 1a. Arranged on an optical path, along which the light from the halogen lamp 16 passes, are a pair of condenser lenses 17a and 17b, a slide 18 serving as an original, a three-color separating filter 19 and an imaging lens 20. In the illustrated image forming apparatus, a color positive slide is used as the slide 18 serving as an original.

Correspondingly to spectral sensitivities of the respective microcapsules 6C, 6M and 6Y on the substrate 5 of the web 1a, the three-color separating filter 19 is composed of three sectoral filter sections including a red sectoral filter section 19R through which only the light with a wavelength sensible by the cyan microcapsules 6C is allowed to pass, a green sectoral filter section 19G through which only the light with a wavelength sensible by the magenta microcapsules 6M is allowed to pass, and a blue sectoral filter section 19B through which only the light with a wavelength sensible by the yellow microcapsules 6Y is allowed to pass.

With a selected one of the three sectoral filter sections 19R, 19G and 19B located on the optical path, the web 1a is illuminated, through the original slide 18, with a light enough to be sensible by the web 1a. Only one of the three groups of microcapsules 6C, 6M and 6Y, corresponding to the selected filter sectoral section, is photo-cured by the light on the basis of an image on the original slide 18. Likewise, the remaining two filter sectoral sections are successively located on the optical path, and the remaining two groups of microcapsules are successively photo-cured respectively by the lights transmitted through the respective remaining two sectoral filter sections. Thus, three color-decomposed latent images are formed on the web 1a in accordance with the image on the original slide 18.

A sheet feeding cassette 22 is arranged in the vicinity of and above the pair of pressure-developing rollers 13a and 13b. A stack of developing sheets 21 is accommodated in the sheet feeding cassette 22. Each of the developing sheets 21 is coated on its one side with a developer which reacts with the dye precursors contained in the microcapsules 6C, 6M and 6Y on the substrate 5 of the web 1a to develop the color. The developing sheets 21 are fed one by one by a sheet feeding roller 23 toward the nip between the pair of pressure-developing rollers 13a and 13b so that the thus fed sheet is superposed on the web 1a at the nip between the rollers 13a and 13b. The developing sheet 21 and the web 1a are caused to pass under pressure through the nip between the pressure-developing rollers 13a and 13b to rupture the microcapsules 6C, 6M and 6Y remaining uncured, so that the dye precursors are squeezed out of the ruptured microcapsules. The dye precursors squeezed out of the ruptured microcapsules react with the developer coated on the developing sheet 21 so that the latent images on the web 1a are developed onto the developing sheet 21. Thus, a color image is formed on the developing sheet 21. The developing sheet 21 having formed thereon the color image is transported by a belt conveyer 24, and is caused to pass through a nip between a pair of upper and lower heat-fixing rolls 25a and 25b so that the color image is fixed onto the sheet 21. Subsequently, the sheet 21 are discharged onto a tray 26. The heat-fixing rolls 25a and 25b serve to promote the developing reaction between the developer 21 on the developing sheet 21 and the photo and pressure sensitive web 1a, and to impart gloss to the color image on the developing sheet 21.

As described previously, the arrangement of the photo and pressure sensitive recording medium embodying the invention is such that the light-shielding areas 2 and 2 formed by the light-shielding material 2a are provided on and along the respective side edges of the web 1a, and the light-shielding leader section 4 is connected to the leading end of the web 1a. With such arrangement, the light-shielding areas 2 and 2 cooperate with the light-shielding leader section 4 to shield a light from penetrating into the interior of the roll 1, thereby preventing the photo-curable microcapsules 6C, 6M and 6Y on the photo-sensitive recording area E from being exposed.

It is to be understood that the invention is not limited to the above-described specific form, but various modifications and variations can be made to the invention. For example, the photo and pressure sensitive web 1a may be of self-developing type in which the web 1a is coated with both the microcapsules 6C, 6M and 6Y and the developer in a united fashion. That is, the web may be composed of a resinous substrate and a mixture coated on one side of the substrate. The mixture consists of microcapsules each containing a dye precursor and a developer reacting with the dye precursors in the microcapsules to develop a color. The microcapsules and the developer are uniformly dispersed over the one side of the substrate. Further, in place of the photo-curable resin employed in the illustrated embodiment, a resin capable of photo-softened may be mixed in each of the microcapsules 6C, 6M and 6Y. In this case, a photo and pressure sensitive web is used in which the microcapsules 6C, 6M and 6Y are photo-softened at exposure. Moreover, the transparent resinous substrate may have a function of a compensating filter which absorbs a light of specific wavelengths from the light source in compliance with the spectral distribution of the light source or the spectral sensitivities of the respective microcapsules 6C, 6M and 6Y.

Figure 4:
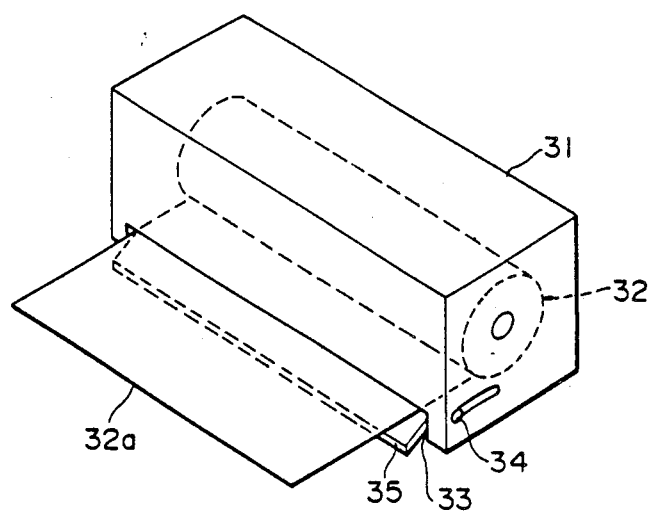
FIG. 4 is a perspective view of the conventional light-shielding arrangement for a photo-sensitive recording medium.
Figure 5:
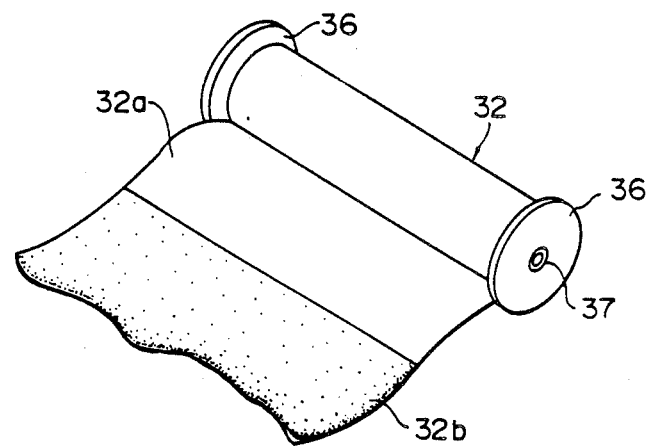
FIG. 5 is a perspective view of another conventional light-shielding arrangement for a photo-sensitive recording medium.

As described above, according to the invention, the light-shielding areas 2 and 2 can shield a light from penetrating into the interface 7 between each pair of adjacent turns of the roll 1 from the axial end faces of the roll 1, thereby ensuring to prevent the web 1a from being unintentionally exposed during storage and transportation. In addition, the light-shielding measures can be taken easily and inexpensively as compared with the prior art illustrated in FIGS. 4 and 5 in which the web roll is accommodated in the light-shielding case, or the web is wound around the flanged core.

What is claimed is:

1. A photo-sensitive recording medium comprising a continuous roll of a photo-sensitive web, said roll being composed of a resinous substrate having microcapsules thereon containing therein dye precursors, said microcapsules being coated on one side of said substrate in such a manner that said microcapsules are uniformly dispersed over the one side of said substrate and light-shielding means provided on opposite side edges of said web, said light-shielding means extending continuously along the opposite side edges of said web for shielding a light from penetrating into an interface between each pair of adjacent turns of said roll from opposite axial end faces of said roll.

2. The photo-sensitive recording medium according to claim 1, wherein said light-shielding means comprises a light-shielding material coated on the opposite side edges of said web.

3. The photo-sensitive recording medium according to claim 2, wherein said light-shielding material is coated on opposite sides of each of said opposite side edges of said web.

4. The photo-sensitive recording medium according to claim 1, wherein said web is provided with a light-shielding leading end portion of a length sufficient to wrap up an outer peripheral surface of said roll.

5. The photo-sensitive recording medium according to claim 4, wherein said leading end portion of said web is coated with a light-shielding material.

6. The photo-sensitive recording medium according to claim 1, which further comprises a light-shielding leader sheet connected to a leading end of said web, said leader sheet having a length sufficient to wrap up an outer peripheral surface of said roll.

7. The photo-sensitive recording medium according to claim 1, wherein said dye precursors include cyan dye precursors, magenta dye precursors and yellow dye precursors.

8. The photo-sensitive recording medium according to claim 1, wherein said web is composed of a resinous substrate and a mixture coated on one side of said substrate, said mixture consisting of microcapsules each containing a dye precursor and a developer reacting with the dye precursors in said microcapsules to develop a color, said microcapsules and said developer being uniformly dispersed over the one side of said substrate.

* * * * *